(12) United States Patent
Agrawal et al.

(10) Patent No.: US 9,692,394 B1
(45) Date of Patent: Jun. 27, 2017

(54) PROGRAMMABLE LOW POWER HIGH-SPEED CURRENT STEERING LOGIC (LPHCSL) DRIVER AND METHOD OF USE

(71) Applicant: Integrated Device Technology, Inc., San Jose, CA (US)

(72) Inventors: Vikas Agrawal, San Jose, CA (US); Feng Qiu, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/081,723

(22) Filed: Mar. 25, 2016

(51) Int. Cl.
H03K 3/00 (2006.01)
H03K 3/012 (2006.01)
H03K 17/687 (2006.01)

(52) U.S. Cl.
CPC ......... *H03K 3/012* (2013.01); *H03K 17/6871* (2013.01)

(58) Field of Classification Search
USPC ........................................................ 327/108
See application file for complete search history.

(56) References Cited

U.S. PATENT DOCUMENTS

| | | | |
|---|---|---|---|
| 4,684,941 A | 8/1987 | Smith et al. | |
| 4,862,485 A | 8/1989 | Guinea et al. | |
| 5,663,105 A | 9/1997 | Yu et al. | |
| 5,748,949 A | 5/1998 | Johnston et al. | |
| 5,757,240 A | 5/1998 | Boerstler et al. | |
| 5,848,355 A | 12/1998 | Rasor et al. | |
| 5,903,195 A | 5/1999 | Lukes et al. | |
| 6,219,797 B1 | 4/2001 | Liu et al. | |
| 6,259,327 B1 | 7/2001 | Balistreri et al. | |
| 6,640,311 B1 | 10/2003 | Knowles et al. | |
| 6,643,787 B1 | 11/2003 | Zerbe et al. | |
| 6,650,193 B2 | 11/2003 | Endo et al. | |
| 6,683,506 B2 | 1/2004 | Ye et al. | |
| 6,727,767 B2 | 4/2004 | Takada et al. | |
| 6,768,387 B1 | 7/2004 | Masuda et al. | |
| 6,870,411 B2 | 3/2005 | Shibahara et al. | |
| 6,959,066 B2 | 10/2005 | Wang et al. | |
| 7,012,476 B2 | 3/2006 | Ogiso et al | |

(Continued)

OTHER PUBLICATIONS

"19-Output PCIE GEN 3 Buffer", Si53019-A01A, Silicon Laboratories Inc., Rev. 1.1 5/2015, 34 Pages.

(Continued)

*Primary Examiner* — Lincoln Donovan
*Assistant Examiner* — Patrick Chen
(74) *Attorney, Agent, or Firm* — Glass & Associates; Kenneth Glass; Molly Sauter

(57) ABSTRACT

An integrated circuit comprising, a voltage regulator circuit and a programmable low power high-speed current steering logic (LPHCSL) driver circuit coupled to a common supply voltage. The voltage regulator circuit includes a native source follower transistor having a negative threshold voltage to provide more headroom for the voltage regulator to operate. The LPHCSL driver circuit includes a plurality of selectable output driver legs and a plurality of programmable resistors. The ability to use a common supply voltage and the ability to select multiple output impedance drivers reduces the die area without increasing the complexity of the integrated circuit.

19 Claims, 4 Drawing Sheets

(56) References Cited

U.S. PATENT DOCUMENTS

| | | |
|---|---|---|
| 7,323,916 B1 | 1/2008 | Sidiropoulos et al. |
| 7,405,594 B1 | 7/2008 | Xu et al. |
| 7,434,083 B1 | 10/2008 | Wilson et al. |
| 7,541,848 B1 | 6/2009 | Masuda et al. |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,737,739 B1 | 6/2010 | Bi et al. |
| 7,741,981 B1 | 6/2010 | Wan et al. |
| 7,750,618 B1 | 7/2010 | Fang et al. |
| 7,786,763 B1 | 8/2010 | Bal et al. |
| 7,800,422 B2 | 9/2010 | Lee et al. |
| 7,816,959 B1 | 10/2010 | Isik et al. |
| 7,907,625 B1 | 3/2011 | MacAdam et al. |
| 7,928,880 B2 | 4/2011 | Tsukamoto |
| 7,941,723 B1 | 5/2011 | Lien et al. |
| 8,010,072 B1 | 8/2011 | Nathawad |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi et al. |
| 8,305,154 B1 | 11/2012 | Kubena et al. |
| 8,416,107 B1 | 4/2013 | Wan et al. |
| 8,432,231 B2 | 4/2013 | Nelson et al. |
| 8,436,677 B2 | 5/2013 | Kull et al. |
| 8,456,155 B2 | 6/2013 | Tamura et al. |
| 8,471,751 B2 | 6/2013 | Wang |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Wright et al. |
| 9,077,386 B1 | 7/2015 | Holden et al. |
| 9,100,232 B1 | 8/2015 | Hormati et al. |
| 9,455,854 B2 | 9/2016 | Gao |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana et al. |
| 2005/0170787 A1 | 8/2005 | Yamamoto et al. |
| 2006/0103436 A1 | 5/2006 | Saitou et al. |
| 2006/0119402 A1 | 6/2006 | Thomsen et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0153252 A1 | 6/2009 | Chen et al. |
| 2009/0184857 A1 | 7/2009 | Furuta et al. |
| 2009/0231901 A1 | 9/2009 | Kim et al. |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai et al. |
| 2010/0090731 A1 | 4/2010 | Casagrande et al. |
| 2010/0109714 A1 | 5/2010 | Lindfors et al. |
| 2010/0164761 A1 | 7/2010 | Wan et al. |
| 2010/0194483 A1 | 8/2010 | Storaska et al. |
| 2010/0240323 A1* | 9/2010 | Qiao .................. G06F 1/06 455/75 |
| 2010/0323643 A1 | 12/2010 | Ridgers et al. |
| 2011/0006936 A1 | 1/2011 | Lin et al. |
| 2011/0032013 A1 | 2/2011 | Nelson et al. |
| 2011/0095784 A1* | 4/2011 | Behel .............. H03K 19/018514 326/82 |
| 2011/0234204 A1 | 9/2011 | Tamura et al. |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0161829 A1 | 6/2012 | Fernald et al. |
| 2012/0200330 A1 | 8/2012 | Kawagoe et al. |
| 2012/0249207 A1 | 10/2012 | Natsume et al. |
| 2012/0262315 A1 | 10/2012 | Kapusta et al. |
| 2012/0293221 A1 | 11/2012 | Ma et al. |
| 2012/0297231 A1 | 11/2012 | Qawami et al. |
| 2012/0317365 A1 | 12/2012 | Elhamias et al. |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2013/0300455 A1 | 11/2013 | Thirugnanam et al. |
| 2014/0021990 A1 | 1/2014 | Na et al. |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0028960 A1 | 1/2015 | Yorita |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2015/0213873 A1 | 7/2015 | Ihm et al. |
| 2016/0013796 A1 | 1/2016 | Choi |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

* cited by examiner

PROGRAMMABLE LOW POWER HIGH-SPEED CURRENT STEERING LOGIC (LPHCSL) DRIVER AND METHOD OF USE

BACKGROUND OF THE INVENTION

Differential signaling is known in the art as a method of transmitting information electronically by means of two complementary signals sent on two separate traces in which a receiving device reads the difference between the two received signals. A driver circuit is generally used to provide the differential signal to be transmitted to the receiver circuit.

Low power high-speed current steering logic (LPHCSL) drivers are known in the art as a means of providing differential signaling. In contrast with traditional HCSL, which steers a constant current between true and complement outputs of a differential pair, low power HCSL (LPHCSL) uses a push-pull voltage drive instead of a current drive. Current consumption is reduced in a programmable LPHCSL driver because supply current flows in the driver only during the round trip flight time, which is equivalent to the time required for a rising edge of the signal from the LPHCSL driver to be received at the receiver and the time required for the signal to be returned back at the driver.

Current architectures of LPHCSL drivers have limitations on the range of the supply voltage of operation. Additionally, LPHCSL driver designs currently known in the art provide multiple driver impedances by adding and/or subtracting driver legs, which has a negative impact on the die area and increases the complexity of the device for slew rate control and impedance load matching.

Accordingly, what is needed in the art is a programmable LPHCSL driver circuit having an improved supply voltage range and a higher degree of programmability for impedance matching that does not negatively impact the die area required for the circuit.

SUMMARY

The present invention describes a programmable LPHCSL driver circuit having an improved supply voltage range and a higher degree of programmability for impedance matching that does not negatively impact the die area required for the circuit and an associated method of use.

In one embodiment, an integrated circuit is provided comprising, a voltage regulator circuit and a programmable low power high-speed current steering logic (LPHCSL) driver circuit coupled to a common supply voltage. The voltage regulator circuit includes a native source follower transistor having a negative threshold voltage to provide more headroom for the voltage regulator to operate. The programmable LPHCSL driver circuit includes a plurality of selectable output driver legs and a plurality of programmable resistors. The ability to use a common supply voltage and the ability to select multiple output impedance drivers reduces the die area without increasing the complexity of the integrated circuit.

In accordance with one embodiment, an integrated circuit is provided including a voltage regulator circuit having a voltage comparator and a native source follower transistor, wherein the common supply voltage is coupled to the voltage comparator and the native source follower transistor. The integrated circuit further includes, a programmable low power high-speed current steering logic (LPHCSL) driver circuit comprising a plurality of selectable output driver legs and a plurality of programmable resistors and a common supply voltage coupled to the voltage regulator circuit and to the programmable LPHCSL driver circuit. The integrated circuit may further include, a control logic circuit coupled to the programmable LPHCSL driver circuit, the control logic circuit for selecting one or more of the selectable output driver legs and for programming one or more of the plurality of programmable resistors.

In a particular embodiment, the native source follower transistor is a native n-channel metal-oxide-semiconductor (NMOS) transistor having a negative threshold voltage of approximately 0.2V.

In a specific embodiment, the common supply voltage is selected to be 3.3V, 2.5V or 1.8V, the reference voltage is between about 0.6V and 1.2V, the output voltage at the second terminal of the voltage regulator and the drain of the native source follower transistor is between about 0.6V and 1.2V and each of the plurality of programmable resistors are programmable to provide a resistance of 100Ω, or 85Ω.

In accordance with the present invention, a method for providing a low power high-speed current steering logic (LPHCSL) driver output signal includes, providing a selected supply voltage to a voltage regulator circuit and a programmable LPHCSL driver circuit, wherein the voltage regulator circuit comprises a native source follower transistor, providing a desired reference voltage to the voltage regulator circuit to set an output level for an output signal from the LPHCSL driver circuit and selecting one or more of a plurality of selectable output driver legs of the LPHCSL driver circuit and programming one or more of a plurality of programmable resistors of the LPHCSL driver circuit to provide an output signal from the LPHCSL driver having a desired impedance across the selected supply voltage.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
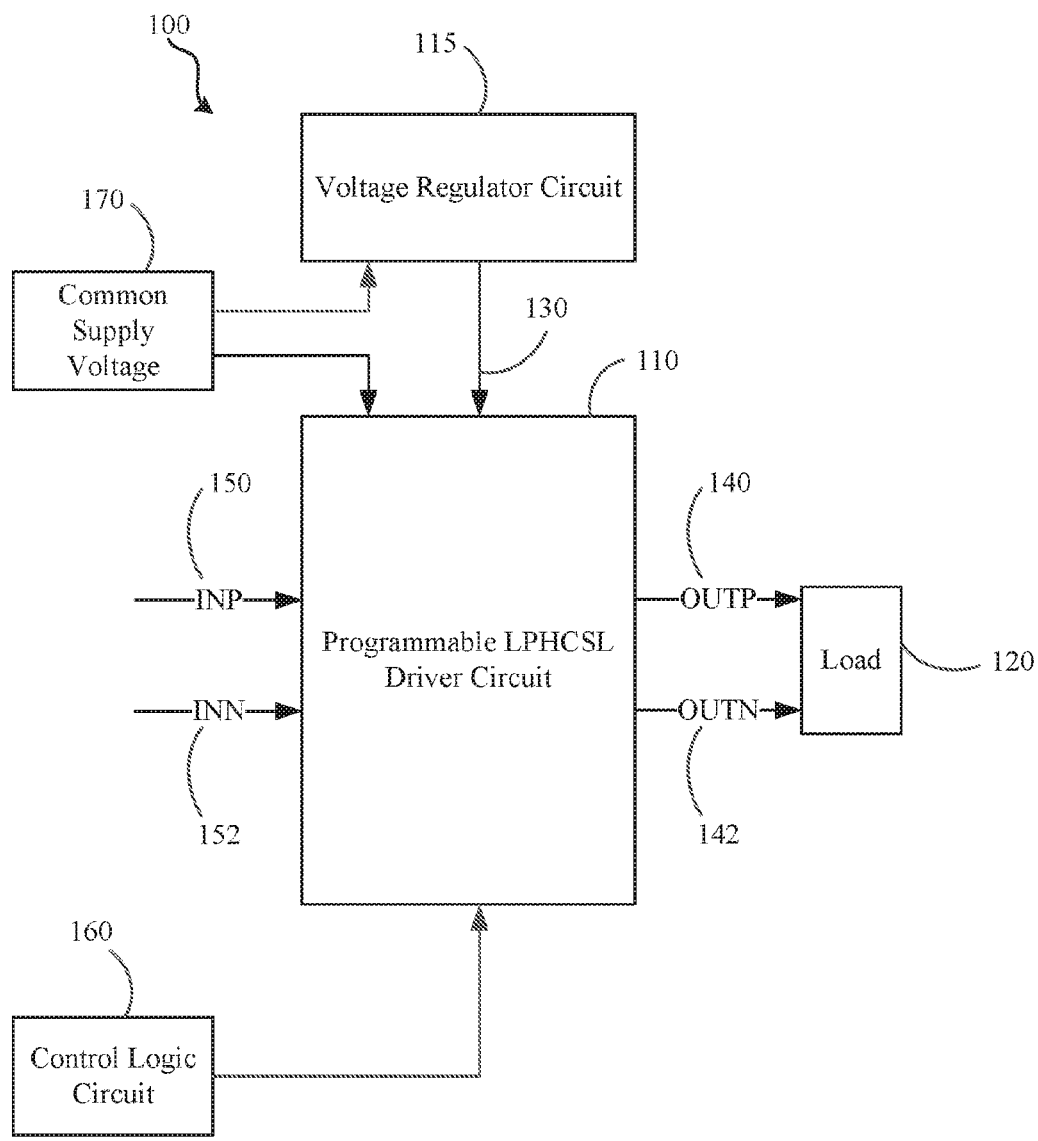
FIG. 1 is a block diagram of a programmable low power high-speed current steering logic (LPHCSL) driver, in accordance with an embodiment of the present invention.

Representative embodiments of the present invention are described below with reference to various examples wherein like reference numerals are used throughout the description and several view of the drawings to indicate like or corresponding parts and further wherein the various elements are not necessarily drawn to scale.

With reference to FIG. 1, an integrated circuit according to an embodiment of the present invention is illustrated and generally designated 100. In at least some embodiments, the integrated circuit 100 includes a voltage regulator circuit 115, a programmable low power high-speed current steering logic driver circuit 110 and a control logic circuit 160. A common supply voltage 170 is coupled to the voltage regulator circuit 115 and to the programmable LPHSCL driver circuit 110 and a load 120 is coupled across the true output 140 and the complimentary output 142 of the programmable LPHCSL driver circuit 110. In operation of the integrated circuit 100, a common supply voltage 170 is provided to the voltage regulator circuit 115 and the programmable LPHCSL driver circuit and an output level 130 of the voltage regulator circuit 115 is provided to the programmable LPHCSL driver circuit 110 to set the output level of the true output 140 and the complimentary output 142 of the LPHCSL driver circuit 110 in response to a true input 150 and a complimentary input 152 to the programmable LPHCSL driver circuit 110. The impedance of the LPHSCL driver circuit changes based upon the common supply voltage 170 and it is desirable to maintain a substantially constant impedance over the supply voltage range in order to minimize complexity and reduce the cost of system implementations employing the LPHSCL driver circuit 110. In addition, the impedance requirements for the LPHSCL driver circuit 100, for the same common supply voltage 170, can vary based upon the target application. In order to maintain a substantially constant impedance at the output of the LPHCSL driver circuit 110, a control logic circuit 160 is coupled to the programmable LPHSCL driver circuit 110 to provide control signals to the programmable LPHSCL driver circuit 110 to select one or more driver legs and one or more programmable resistors to control the output impedance of the LPHSCL driver circuit 110.

Figure 2:
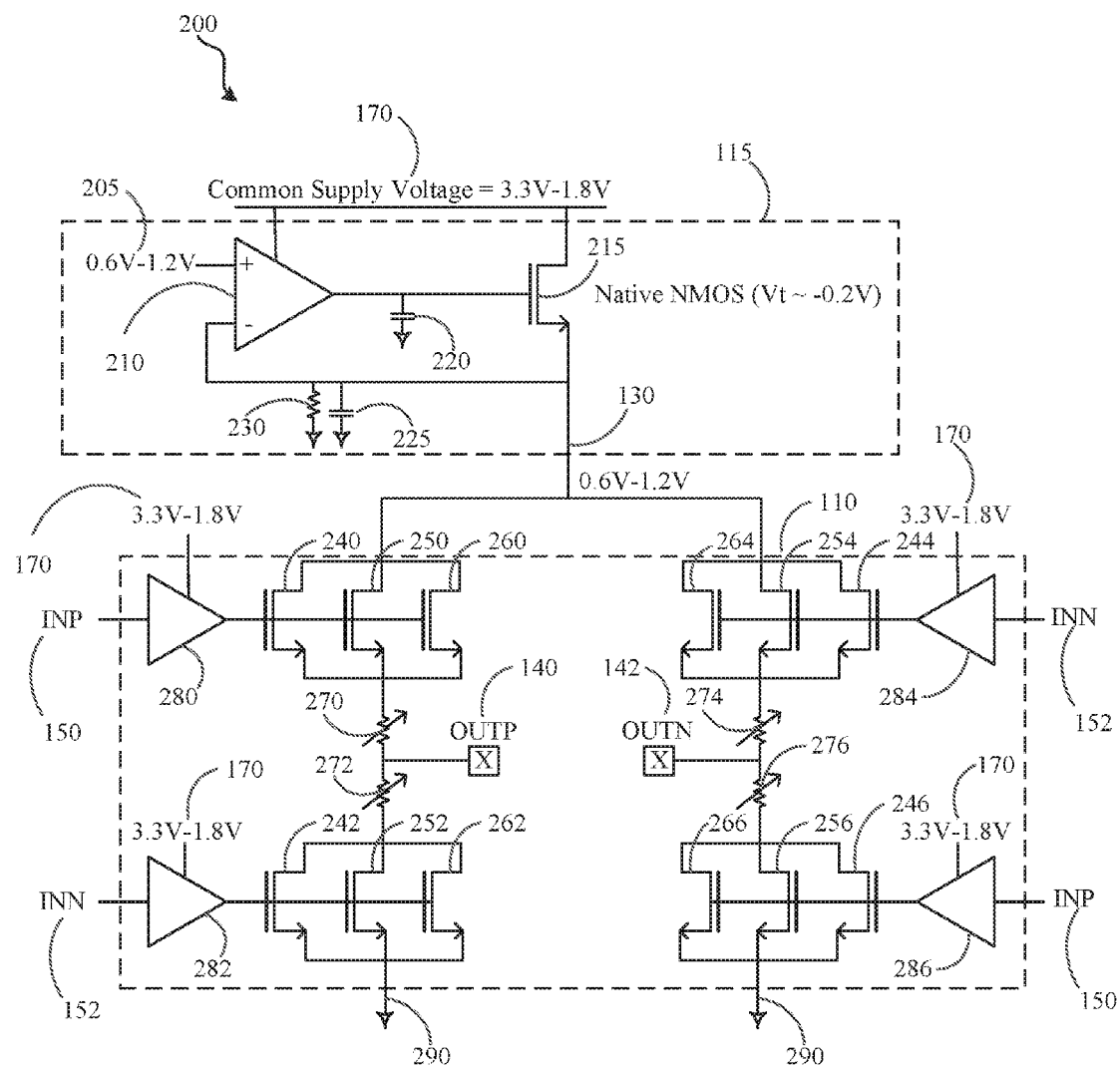
FIG. 2 is a schematic diagram illustrating a programmable low power high-speed current steering logic (LPHCSL) driver, in accordance with an embodiment of the present invention.

With reference to FIG. 2, an integrated circuit 200 in accordance with one embodiment of the present invention includes a voltage regulator circuit 115 for providing an output level 130 to a programmable LPHCSL driver circuit 110. In at least one embodiment, the voltage regulator circuit 115 includes a voltage comparator 210 having a first input for receiving a reference voltage 205 and a bias input coupled to the common supply voltage 170. In a particular embodiment, the reference voltage 205 is between about 0.6V and 1.2V and the common supply voltage 170 is between about 3.3V and 1.8V. The reference voltage 205 may be generated using techniques known in the art, such as bandgap and switches. The voltage regulator circuit 115 further includes a native source follower transistor 215 coupled to the voltage comparator 210. In particular, the native source follower transistor 215 has a gate coupled to an output of the voltage comparator 205, a drain coupled to the common supply voltage 170 and a source coupled to the LPHCSL driver circuit 110 and to a second input of the voltage comparator 210. The voltage regulator circuit 115 further includes a first capacitor 220 having a first terminal coupled between the output of the voltage comparator 210 and the gate of the native source follower transistor 215 and a second terminal coupled to ground 290. The first capacitor 220 provides required stability margins and bandwidth. The voltage regulator circuit 115 further includes a second capacitor 225 having a first terminal coupled between the source of the native source follower transistor 215 and a second input of the voltage comparator 210 and a second terminal coupled to ground 290 and a first resistor 230 having a first terminal coupled between the source of the native source follower transistor 215 and a second input of the voltage comparator 210 and a second terminal coupled to ground 290. The second capacitor 225 in the feedback path acts as a bypass capacitor and the resistor 230 in the feedback path sets up the output voltage level 130 at the output of the native source follow transistor 215 to match the reference voltage 205 input to the voltage comparator 210. In a particular embodiment, the output voltage level 130 may be between about 0.6V and 1.2V. In the present embodiment the native source follower transistor 215 is a native n-channel metal-oxide-semiconductor (NMOS) transistor. In one embodiment, the native source follower transistor 215 is a native n-channel metal-oxide-semiconductor (NMOS) transistor having a negative threshold voltage. In a specific embodiment, the native source follower transistor 215 may be a native n-channel metal-oxide-semiconductor (NMOS) transistor having a negative threshold voltage of approximately 0.2V.

The prior art limitations on low supply voltages are primarily a result of headroom issues related to the voltage regulator driving the output source follow transistor are commonly resolved by utilizing separate supply voltages for the voltage regulator and the LPHSCL driver circuit. However, utilizing separate supply voltages limits the programmable lower supply voltage range. To overcome this limitation, the present invention utilizes a high voltage tolerant native source follower transistor 215 having a negative threshold voltage, thereby providing more headroom, which allows the voltage regulator circuit 115 to operate at a much lower voltage. The implementation of the present invention allows for low voltage (i.e. 1.8V) operation of the voltage regulator and the LPHCSL driver circuit and for sharing of a common supply voltage, which allows a more dynamic range of voltages (i.e. 3.3V-1.8V), resulting in reduced complexity in circuitry and ESD protection schemes as result of a simplified supply voltage distribution requirement. Accordingly, the use of a native source follower transistor 215 in the voltage regulator circuit 115 provides the implementation of a highly versatile LPHCSL driver circuit 110 that is capable of operating across multiple supply voltages (3.3V-1.8V), with a reduced die area and an acceptable signal profile.

With reference again to FIG. 2, the integrated circuit 200 further includes a programmable LPHCSL driver circuit 110 coupled to the voltage regulator circuit 115 and the programmable LPHCSL driver circuit 110 further includes a plurality of programmable resistors 270, 272, 274, 276 and a plurality of selectable output driver legs. In the embodiment illustrated in FIG. 2, the plurality of selectable output driver legs include at least one first transistor 240 coupled to an output of first pre-driver circuit 280 that is driven by a true input signal 150 and at least one second transistor 242 coupled to an output of a second pre-driver circuit 282 that is driven by the complement 152 of the true input signal 150. A first variable resistor 270 and a second variable resistor 272 are coupled in series with the first transistor 240 and the second transistor 242, thereby providing a true output signal 140 at a node between the first variable resistor 270 and the second variable resistor 272. In a specific embodiment, one of the plurality of selectable output driver legs may be considered as including a selectable pull-up transistor 240 having a drain coupled to an output 130 of the voltage regulator circuit 110 and a selectable pull-down transistor 242 having a source coupled to ground 290 and at least two of the plurality of programmable resistors 270, 272 coupled in series between a source of the pull-up 240 transistor and a drain of the pull-down transistor 242 to provide an output signal of the programmable LPHCSL driver coupled between the series programmable resistors 270, 272. In this circuit configuration, the pull-up transistor 240 is coupled to a first pre-driver circuit 280 that is driven by a true input signal 150 and the pull-down second transistor 242 is coupled to a second pre-driver circuit that is driven by a complementary input signal 152 provides a true output signal 140 at an intersection of a pair of series programmable resistors 270, 272 based upon a selected common supply voltage 170 and a desired impedance output.

In the exemplary embodiment, illustrated in FIG. 2, three selectable driver legs and four programmable resistors are used to provide selected combinations of three voltage levels (3.3V, 2.5V and 1.8V) and at two resistances (100Ω, and 85Ω) to provide a selected combination of series resistance and driver strengths of: 3.3V/100Ω, 3.3V/85Ω, 2.5V/100Ω, 2.5/85Ω, 1.8V/100Ω and 1.8V/85Ω. The control logic circuit 160 is coupled to the programmable LPHCSL driver to provide input signals for selecting one or more of the selectable output driver legs and for programming one or more of the plurality of programmable resistors, as will be explained in more detail with reference to FIG. 3.

Referring again to FIG. 2, the programmable LPHCSL driver 110 further includes a plurality of pre-driver circuit 280, 282, 284, 286, wherein each of the plurality of pre-driver circuits 280, 282, 284, 286 are coupled to one of a plurality of selectable output driver legs and the common supply voltage 170 is coupled to an enable input of each of the plurality of pre-driver circuits 280, 282, 284, 286. In general, each of the pre-driver circuits has an input coupled to a true input or a complimentary input signal and one or more outputs coupled to a gate of one of each of the plurality of selectable output driver legs. Additionally, each of the plurality of selectable output driver legs includes a first n-channel metal-oxide-semiconductor (NMOS) transistor having a gate coupled to a pre-driver circuit and a drain coupled to an output from the voltage regulator circuit 115, a first programmable resistor having a first terminal coupled to a source of the first NMOS transistor, a second programmable resistor having first terminal coupled to a second terminal of the first programmable resistor and a second n-channel metal-oxide-semiconductor (NMOS) transistor having a gate coupled to the pre-driver circuit, a drain coupled to a second terminal of the second programmable resistor and a source coupled to ground.

In the exemplary embodiment shown in FIG. 2, employing NMOS transistors in the programmable LPHCSL driver circuit, a first pre-driver circuit 280 and a second pre-driver circuit 284. The first pre-driver circuit 280 having an input coupled to a true input 150 and the second pre-driver circuit 284 having an input coupled to a complimentary input 152. The output of the first pre-driver circuit 280 is coupled to the gate of each of three parallel-coupled NMOS transistors 240, 250, 260 and the output of the second pre-driver circuit 284 is coupled to the gates of three parallel-coupled NMOS transistors 244, 254, 264. The drain of each of the NMOS transistors 240, 250, 260, 244, 254, 264 is coupled to the output 130 of the voltage regulator circuit 115 and the source of each of the NMOS transistors 240, 250, 260 is coupled to a first terminal of a first variable resistor 270 and the source of each of the NMOS transistors 244, 254, 264 is coupled to a first terminal of a second variable resistor 274. The programmable LPHCSL driver circuit further includes, a third pre-driver circuit 282 and a fourth pre-driver circuit 286. The third pre-driver circuit 282 having an input coupled to a complimentary input 152 and the fourth pre-driver circuit 286 having an input coupled to a true input 150. The output of the third pre-driver circuit 282 is coupled to the gate of each of three parallel-coupled NMOS transistors 242, 252, 262 and the output of the fourth pre-driver circuit 286 is coupled to the gates of three parallel-coupled NMOS transistors 246, 256, 266. The drain of each of the NMOS transistors 242, 252, 262 is coupled to a second terminal of a third variable resistor 272 and the first terminal of the third variable resistor 272 is coupled to a second terminal of the first variable resistor 270. The drain of each of the NMOS transistors 246, 256, 266 is coupled to a second terminal of a fourth variable resistor 276 and the first terminal of the fourth variable resistor 276 is coupled to a second terminal of the second variable resistor 274. The source of each of the NMOS transistors 242, 252, 262, 246, 256, 266 is coupled ground 290. In this configuration, three selectable driver legs are provided for driving three voltage levels of 3.3V, 2.5V and 1.8V and the four programmable resistors are provided output resistances of 100Ω or 85Ω to provide impedance matching. As such, a combination of selected driver legs and resistance values provides 100Ω or 85Ω impedances across 3.3V, 2.5V and 1.8V.

Figure 3:
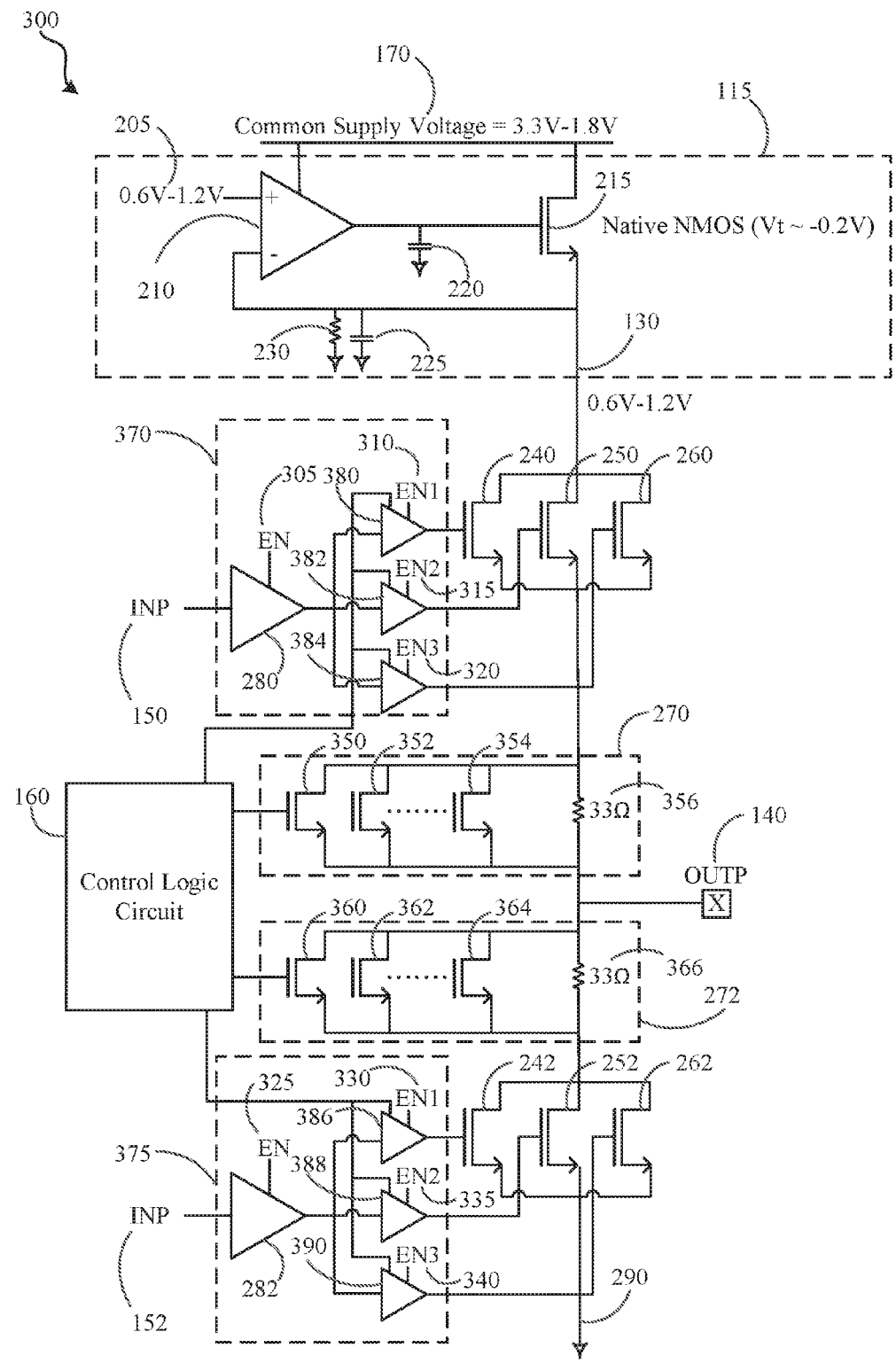
FIG. 3 is a detailed schematic illustrating an exemplary pre-driver circuit and an exemplary programmable resistor of a programmable low power high-speed current steering logic (LPHCSL) driver, in accordance with an embodiment of the present invention.

With reference to FIG. 3, an integrated circuit 300 is illustrated showing the voltage regulator circuit 115 and a partial view of the programmable LPHCSL driver circuit 110. The partial view of the programmable LHPCSL driver circuit illustrates one true and complementary circuit configuration in additional detail. As shown in FIG. 3, and as previously described, the voltage regulator circuit 115 includes a voltage comparator 210 having a first input for receiving a reference voltage 205 and a bias input coupled to the common supply voltage 170 and in a particular embodiment, the reference voltage 205 is between about 0.6V and 1.2V and the common supply voltage 170 is between about 3.3V and 1.8V. The voltage regulator circuit 115 further includes a native source follower transistor 215 coupled to the voltage comparator 210. In particular, the native source follower transistor 215 has a gate coupled to an output of the voltage comparator 205, a drain coupled to the common supply voltage 170 and a source coupled to the LPHCSL driver circuit 110 and to a second input of the voltage comparator 210. The voltage regulator circuit 115 further includes a first capacitor 220 having a first terminal coupled between the output of the voltage comparator 210 and the gate of the native source follower transistor 215 and a second terminal coupled to ground 290. The voltage regulator circuit 115 further includes a second capacitor 225 having a first terminal coupled between the source of the native source follower transistor 215 and a second input of the voltage comparator 210 and a second terminal coupled to ground 290 and a first resistor 230 having a first terminal coupled between the source of the native source follower transistor 215 and a second input of the voltage comparator 210 and a second terminal coupled to ground 290. In the embodiment illustrated in FIG. 3, the output voltage level 130 of the voltage regulator 115 is coupled to a drain of three parallel-coupled pull-up NMOS transistors 240, 250, 260 and the source of the three parallel-coupled NMOS transistors 240, 250, 260 is coupled to a first terminal of a first variable resistor 270. A gate terminal of each of the three parallel-coupled pull-up NMOS transistors 240, 250, 260 is coupled to a first selectable pre-driver circuit 370 driven by a true input 150. A second terminal of the first variable resistor 270 is coupled to a first terminal of a second variable resistor 272 and the second terminal of the second variable resistor 272 is coupled to a drain of three parallel-coupled pull-down NMOS transistors 242, 252, 262. A source terminal of each of the three parallel-coupled pull-down NMOS transistors 242, 252, 262 is coupled to ground 290 and a gate terminal of each of the three parallel-coupled pull-down NMOS transistors 242, 252, 262 is coupled to an output of a second selectable pre-driver circuit 375 driven by a complimentary input 152.

In the prior art, the transistors of the LPHCSL driver circuit are utilized to provide secondary protection, thereby sharing the load for ESD events. Accordingly, in the device layout of the LPHCSL driver in the prior art, the drain contact to gate spacing (DCGS) is large so that the LPHCSL driver is capable of handling large currents under snapback (ESD) conditions. In contrast, in the present invention a non-snapback technique is implemented in the LPHCSL driver circuit to reduce the die area and to enhance the driver performance. The non-snapback technique in accordance with the present invention is a non-self protecting implementation of the device layout for the parallel-coupled pull-up NMOS transistors 240, 250, 260 and the parallel-coupled pull-down NMOS transistors 242, 252, 262. The device layout implemented in the present invention reduces the drain contact to gate spacing (DCGS) of the transistors to minimum layout dimension/rules, thereby resulting in less area and offering lower capacitance. Accordingly, an ESD device relying on a dedicated RC trigger may be added in parallel with the transistors of the LPHCSL driver circuit.

In the embodiment illustrated in FIG. 3, the first selectable pre-driver circuit 370 and the second selectable pre-driver circuit 275 are shown in additional detail to include a primary pre-driver circuits and three secondary pre-driver circuits. The first selectable pre-driver circuit 270 includes the primary pre-driver circuit 280 have an input coupled to a true input signal 150, an enable input 305 and an output coupled to each of three secondary pre-driver circuits 380, 382, 384, each of the three secondary pre-driver circuits 380, 382, 384 coupled to the control logic circuit 160 and each of the secondary pre-driver circuits 380, 382, 384 comprising an enable input 310, 315, 320. The output of each of the second pre-driver circuits is coupled to a gate of one of the three parallel-coupled pull-up transistors 240, 250, 260. The second selectable pre-driver circuit 375 includes the primary pre-driver circuit 282 having an input coupled to a complimentary input signal 152, an enable input 325 and an output coupled to each of three secondary pre-driver circuits 386, 388, 390, each of the three secondary pre-driver circuits 386, 388, 390 coupled to the control logic circuit 160 and each of the secondary pre-driver circuits 386, 388, 390 comprising an enable input 330, 335, 340. The output of each of the secondary pre-driver circuits 386, 388, 390 is coupled to a gate of one of the three parallel-coupled pull-up transistors 242, 252, 262. In this embodiment, the secondary pre-driver circuits 380, 382, 384, 386, 388, 390 are used to select one or more driver legs and variable resistor values to provide the desired driver impedance at an output of the programmable LPHCSL driver circuit. The secondary pre-driver circuit 380, 382, 384, 386, 388, 390 for each selected driver leg is controlled separately to allow for slew rate programming. The selection of driver impedance, including the driver stages and variable resistor value, slew rate and output levels are determined by the control logic circuit 160 which may be based on values written in a register, such as an I²C register.

As shown in FIG. 3, the programmable LPHCSL driver circuit further includes a plurality of NMOS transistors 350, 352, 354, 360, 362, 364 coupled in parallel across each of the plurality of programmable resistors 356, 366 and each of the plurality of NMOS transistors 350, 352, 354, 360, 362, 364 having a gate coupled to the control logic circuit 160. The plurality of NMOS transistors 350, 352, 354, 360, 362, 364 are used to program the programmable resistor 270, 272 by programming the gate of each of the NMOS transistors 350, 352, 354, 360, 362, 364 added in parallel. This is an exemplary embodiment, and various other circuit configurations for programming the programmable resistors are known in the art and within the scope of the present invention.

Figure 4:
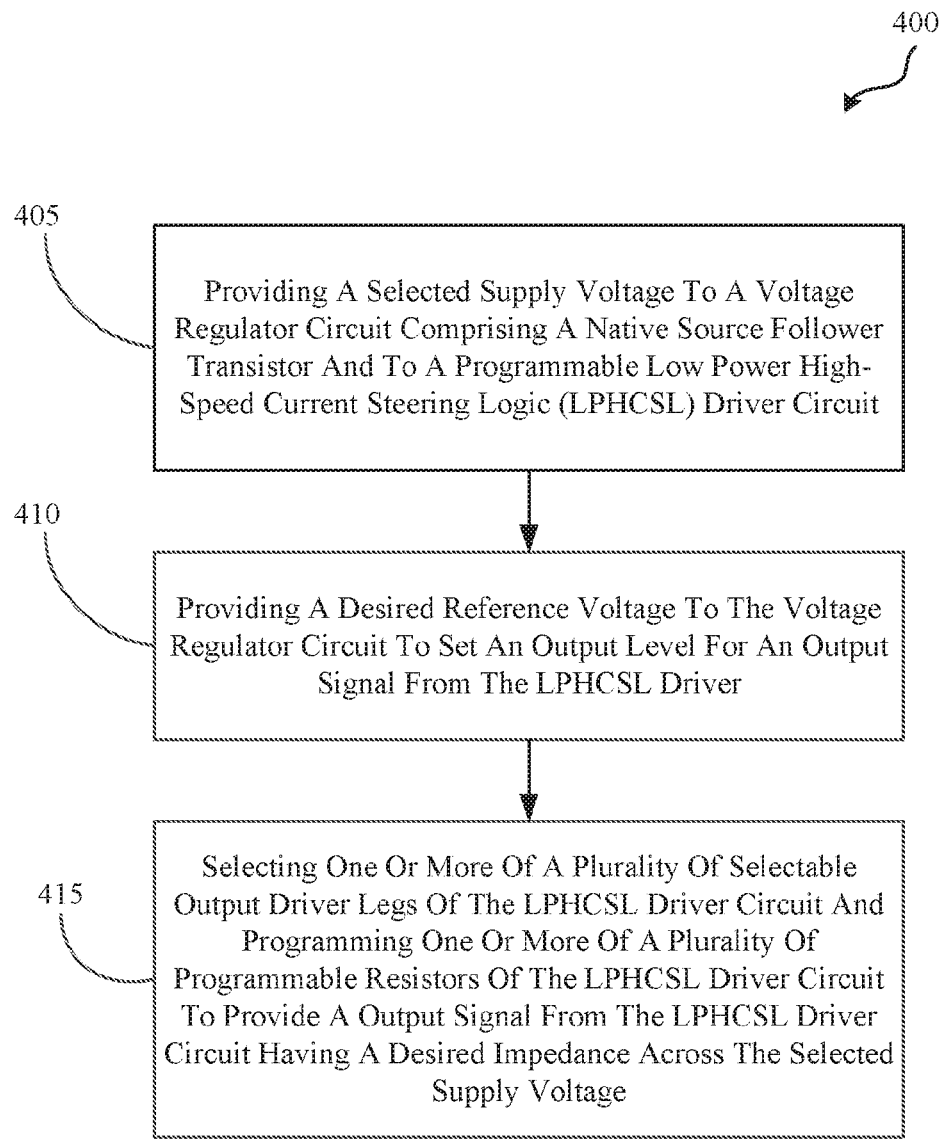
FIG. 4 is a flow diagram illustrating a method for providing an output voltage from a programmable LPHCSL driver, in accordance with an embodiment of the present invention.

With reference to FIG. 4, in accordance with the present invention, a method 400 for providing a output voltage from a programmable LPHCSL driver includes, providing a selected supply voltage to a voltage regulator circuit and a programmable LPHCSL driver circuit of a programmable LPHCSL driver circuit, wherein the voltage regulator circuit comprises a native source follower transistor 405. With reference to FIG. 2, in one embodiment, a selected supply voltage may be provided by a common supply voltage 170 to a voltage regulator circuit 115 and a programmable LPHCSL driver circuit 110 and the voltage regulator circuit 115 may include a native source follower transistor 215. In an exemplary embodiment, the common voltage supply 170 may be 3.3V, 2.5V or 1.8V.

After the voltage supply has been provided the method of the present invention continues by providing a desired reference voltage to the voltage regulator circuit to set an output level for an output signal from the LPHCSL driver circuit 410. With reference to FIG. 2, a desired reference voltage 205 may be provided to a voltage comparator 210 of the voltage regulator circuit 115 to set an output level for an output signal 130 from the LPHCSL driver circuit 110. In an exemplary embodiment, the desired reference voltage may be between 0.6V and 1.2V.

Following the setting of the output level, the method continues by selecting one or more of a plurality of selectable output driver legs of the LPHCSL driver circuit and programming one or more of a plurality of programmable resistors of the LPHCSL driver circuit to provide an output signal from the LPHCSL driver having a desired impedance across the selected supply voltage 415. With reference to FIG. 3, selecting one or more of the plurality of selectable output driver legs of the LPHCSL driver circuit 110 and programming one or more of a plurality of programmable resistors of the LPHCSL driver circuit may be implemented by a plurality of pre-driver circuits 280, 282, 284, 286 in combination with a control logic circuit 160.

The present invention describes a programmable LPHCSL driver circuit having an improved supply voltage range and a higher degree of programmability for impedance matching that does not negatively impact the die area required for the circuit, and an associated method of use.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, the voltage regulator and the LPHCSL driver circuit may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An integrated circuit comprising:
   a voltage regulator circuit including a voltage comparator and a native source follower transistor;
   a programmable low power high-speed current steering logic (LPHCSL) driver circuit comprising a plurality of selectable output driver legs and a plurality of programmable resistors; and
   a common supply voltage coupled to the voltage regulator circuit, the voltage comparator, the native source follower transistor and to the programmable LPHCSL driver circuit.

2. The integrated circuit of claim 1, further comprising a control logic circuit coupled to the programmable LPHCSL driver circuit, the control logic circuit for selecting one or more of the selectable output driver legs and for programming one or more of the plurality of programmable resistors.

3. The integrated circuit of claim 1, wherein the native source follower transistor is a native n-channel metal-oxide-semiconductor (NMOS) transistor.

4. The integrated circuit of claim 1, wherein the native source follower transistor is a native n-channel metal-oxide-semiconductor (NMOS) transistor having a negative threshold voltage.

5. The integrated circuit of claim 1, wherein the native source follower transistor is a native n-channel metal-oxide-semiconductor (NMOS) transistor having a negative threshold voltage of approximately 0.2V.

6. The integrated circuit of claim 1, wherein the common supply voltage is coupled to a bias input of the voltage comparator and a drain of the native source follower transistor, and the voltage regulator circuit further comprises:
   a reference voltage coupled to a first input of the voltage comparator;
   a source of the native source follower transistor coupled to a second input of the voltage comparator;
   a first capacitor having a first terminal coupled between an output of the voltage comparator and a gate of the native source follower transistor and a second terminal coupled to ground;
   a second capacitor having a first terminal coupled between the source of the native source follower transistor and a second input of the voltage comparator and a second terminal coupled to ground; and
   a first resistor having a first terminal coupled between the source of the native source follower transistor and a second input of the voltage comparator and a second terminal coupled to ground.

7. The integrated circuit of claim 1, wherein the supply voltage is between about 3.3V and about 1.8V, the reference voltage is between about 0.6V and 1.2V and an output voltage at the second terminal of the voltage regulator and the source of the native source follower transistor is between about 0.6V and 1.2V.

8. The integrated circuit of claim 1, wherein each of the plurality of programmable resistors are programmable to provide a resistance of 100Ω or 85Ω.

9. The integrated circuit of claim 1, wherein the programmable LPHCSL driver circuit further comprises a plurality of pre-driver circuits coupled to each of the plurality of selectable output driver legs, wherein the common supply voltage is coupled to each of the plurality of pre-driver circuits.

10. The integrated circuit of claim 9, wherein the common supply voltage is coupled to an enable input of each of the plurality of pre-driver circuits.

11. An integrated circuit comprising:
    a voltage regulator circuit;
    a programmable low power high-speed current steering logic (LPHCSL) driver circuit comprising a plurality of selectable output driver legs and a plurality of programmable resistors, the programmable LPHCSL driver circuit including:
       a plurality of pre-driver circuits, each of the pre-driver circuits having an input coupled to a true input or a complimentary input signal and one or more outputs coupled to a gate of one of each of the plurality of selectable output driver legs, wherein each of the plurality of selectable output driver legs further comprises a plurality of selectable pull-up transistors having a drain coupled to an output of the voltage regulator circuit and a plurality of pull-down transistors have a source coupled to ground;
       at least two of the plurality of programmable resistors coupled in series between a source of each of the plurality of pull-up transistors and a drain of each of the plurality of pull-down transistors; and
       an output signal of the integrated circuit coupled between the at least two of the plurality of programmable resistors coupled in series; and
    a common supply voltage coupled to the voltage regulator circuit and to the programmable LPHCSL driver circuit.

12. The integrated circuit of claim 11, wherein each of the plurality of selectable output driver legs further comprises:
    a first n-channel metal-oxide-semiconductor (NMOS) transistor having a gate coupled to the pre-driver circuit and a drain coupled to an output from the voltage regulator circuit;
    a first programmable resistor having a first terminal coupled to a source of the first NMOS transistor;
    a second programmable resistor having first terminal coupled to a second terminal of the first programmable resistor; and
    a second NMOS transistor having a gate coupled to the pre-driver circuit, a drain coupled to a second terminal of the second programmable resistor and a source coupled to ground.

13. The integrated circuit of claim 11, wherein the pre-driver circuit further comprises a plurality of selectable pre-driver circuits coupled to the control logic circuit and to one of the plurality of selectable output driver legs.

14. The integrated circuit of claim 11, further comprising a plurality of n-channel metal-oxide-semiconductor (NMOS) transistors coupled in parallel across each of the plurality of programmable resistors and each of the plurality of NMOS transistors having a gate coupled to the control logic circuit, wherein the plurality of NMOS transistors are used to program the programmable resistor.

15. An integrated circuit comprising:
a voltage regulator circuit comprising a voltage comparator and a native source follower transistor, wherein the common supply voltage is coupled to the voltage comparator and the native source follower transistor;
a programmable low power high-speed current steering logic (LPHCSL) driver circuit comprising a plurality of selectable output driver legs and a plurality of programmable resistors;
a common supply voltage coupled to the voltage regulator circuit and to the programmable LPHCSL driver circuit; and
a control logic circuit coupled to the programmable LPHCSL driver circuit, the control logic circuit for selecting one or more of the selectable output driver legs and for programming one or more of the plurality of programmable resistors.

16. A method comprising:
providing a selected supply voltage to a voltage regulator circuit and a programmable low power high-speed current steering logic (LPHCSL) driver circuit, wherein the voltage regulator circuit comprises a native source follower transistor;
providing a desired reference voltage to the voltage regulator circuit to set an output level for an output signal from the programmable LPHCSL driver circuit; and
selecting one or more of a plurality of selectable output driver legs of the programmable LPHCSL driver circuit and programming one or more of a plurality of programmable resistors of the programmable LPHCSL driver circuit to provide an output signal from the programmable LPHCSL driver having a desired impedance across the selected supply voltage.

17. The method of claim 16, wherein the native source follower transistor is a native NMOS transistor having a negative threshold voltage.

18. The method of claim 16, wherein the supply voltage is selected from 3.3V, 2.5V and 1.8V.

19. The method of claim 16, wherein the desired reference voltage is between about 0.6V and 1.2V.

* * * * *